(12) United States Patent
Nikitin et al.

(10) Patent No.: US 6,651,239 B1
(45) Date of Patent: Nov. 18, 2003

(54) DIRECT TRANSFORMATION OF ENGINEERING CHANGE ORDERS TO SYNTHESIZED IC CHIP DESIGNS

(75) Inventors: Andrey A. Nikitin, Moscow (RU); Andrej A. Zolotykh, Moskovskaya Oblast (RU); Nikola Radovanovic, Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 144 days.

(21) Appl. No.: 10/008,089

(22) Filed: Nov. 13, 2001

(51) Int. Cl.[7] .............................................. G06F 17/50
(52) U.S. Cl. ................... 716/18; 716/1; 716/3
(58) Field of Search ........................... 716/18, 1, 3, 10, 716/5, 7

(56) References Cited

U.S. PATENT DOCUMENTS

| | | | | |
|---|---|---|---|---|
| 5,341,308 A | * | 8/1994 | Mendel | 716/7 |
| 5,436,849 A | * | 7/1995 | Drumm | 716/18 |
| 5,541,849 A | * | 7/1996 | Rostoker et al. | 364/489 |
| 5,761,079 A | * | 6/1998 | Drumm | 716/11 |
| 5,867,396 A | * | 2/1999 | Parlour | 716/18 |
| 6,134,705 A | * | 10/2000 | Pedersen et al. | 716/18 |
| 6,226,777 B1 | * | 5/2001 | Zhang | 716/5 |
| 6,249,902 B1 | * | 6/2001 | Igusa et al. | 716/10 |
| 6,253,351 B1 | * | 6/2001 | Fukui et al. | 716/2 |
| 6,298,319 B1 | * | 10/2001 | Heile et al. | 703/26 |
| 6,378,114 B1 | * | 4/2002 | Shenoy et al. | 716/7 |
| 6,453,454 B1 | * | 9/2002 | Lee et al. | 716/11 |
| 2001/0049815 A1 | * | 12/2001 | Shinomiya et al. | 716/11 |
| 2002/0162086 A1 | * | 10/2002 | Morgan | 716/18 |
| 2003/0084414 A1 | * | 5/2003 | Beletsky | 716/4 |

* cited by examiner

Primary Examiner—Vuthe Siek
Assistant Examiner—Magid Dimyan
(74) Attorney, Agent, or Firm—Westman, Champlin & Kelly, P.C.

(57) ABSTRACT

A change, such as an ECO, is transformed to a gate-level netlist. The change is incorporated in cells of a synthesizable source design. A domain is defined in the netlist that contains cells that are equivalent to the cells of the source design that incorporate the change. The cells of the synthesizable source design that incorporate the change are substituted for the domain in the netlist. The substituted synthesizable source design domain is resynthesized into the gate-level netlist that includes the change.

21 Claims, 3 Drawing Sheets

DIRECT TRANSFORMATION OF ENGINEERING CHANGE ORDERS TO SYNTHESIZED IC CHIP DESIGNS

FIELD OF THE INVENTION

This invention relates to integrated circuit (IC) chip design, and particularly to implementation of engineering change orders (ECOs) to the design of IC chips.

BACKGROUND OF THE INVENTION

Most digital integrated circuit (IC) chips are designed by a highly structured process based on a hardware description language (HDL) methodology. At a source design level, the circuit designer generates a source design document that describes the circuit to be incorporated into an IC chip. The IC design described in the source design is reduced to a design abstraction referred to as the registered transfer level (RTL), which is an IC design abstraction expressed in an HDL language such as Verilog or VHDL. The RTL design abstraction specifies the IC design by an RTL code that describes the operations of the IC chip that are performed on data as they flow between circuit inputs, outputs and clocked registers.

The IC design expressed by the RTL code is synthesized to generate a gate-level description, or netlist. Synthesis is the step taken to translate the architectural and functional descriptions represented by the RTL code to a lower level of representation of the design, such as logic-level and gate-level descriptions. The synthesis tool maps the RTL code into the netlist. Often, the synthesized design is resynthesized to optimize path delays, cell area, gate sizes and other features of the design. The result is often referred to as a resynthesized design.

Thereafter, the IC chip is constructed on a substrate containing a large number of cells that form circuit elements, such as transistors, capacitors, registers and other basic circuit elements. Each cell has one or more pins that are interconnected with complex connection patterns.

The source level document and RTL code are technologically independent. That is, the source level document and RTL code do not specify exact gates or logic devices to be implemented into the IC chip design. The gate-level description, or netlist, is technology dependent. This is because the synthesis tool uses a specific vendor's technology library to map the technology-independent RTL code into the technology-dependent gate-level netlists.

At the RTL level, designers need to include all key design decisions, including design hierarchy and partitioning, clocking scheme, reset scheme and location of registers. Unexpected changes can negatively impact project schedules and cost.

During the design phase, it is often necessary to make local changes to the source design (that is, to the design described in the reference document from which the RTL code is generated). These local changes are usually described in an engineering change order (ECO). Usually, these ECOs are generated after the synthesis of the source design to the netlist is completed and the synthesized design is prepared.

In the past, the ECOs were performed simply by changing the source design and create an entirely new RTL code. The new RTL code was then resynthesized to create an entirely new netlist. While this technique was effective, it also required a considerable amount of time, and was expensive and wasteful because it required resynthesis of the entire RTL code, including portions not affected by the ECO. Accordingly, there is a need for a technique that implements ECOs without recreating an entirely new netlist.

SUMMARY OF THE INVENTION

The present invention is directed to a technique of direct transformation of ECO changes without additional general resynthesis of the source design.

In one form, at least one change is incorporated to cells of a synthesizable source design. A domain of the netlist is defined to contain cells that are equivalent to the cells of the source design that incorporate the change. The cells of the source design that incorporate the change are substituted for the domain in the netlist, and the substituted cells are resynthesized into the gate-level netlist.

In some embodiments, a domain is identified in the netlist that contains cells that are equivalent to cells in the source design. Synthesized design cells in the netlist are identified that are equivalent to source design cells in the source design. A border of the first domain is identified and synthesized design cells are identified that are equivalent to source design cells in at least the border.

In some embodiments, equivalency is based on flags associated with cells in both the design source and netlist. These flags are established in the design source and carried over to the netlist during a resynthesization process. Subsequent changes, such as due to an ECO, are addressed by finding equivalent cells in both the design source and the netlist, using the flags.

In one form, the invention is manifest in a computer readable program containing code that, when executed by a computer, causes the computer to perform the process steps to perform changes to the synthesized design of an IC design based on selected changes, such as ECOs. More particularly, a storage medium contains processor executable instructions that enable a processor to identify at least one domain of a gate-level netlist containing cells to be changed based on at least one change identified in a synthesizable source design. The domain containing cells that are equivalent to cells that are defined by the source design and that include the at least one change.

DETAILED DESCRIPTION OF THE PREFERRED EMBODIMENTS

In accordance with the present invention, a domain is identified that contains all cells of a synthesized design that are changed by an ECO. Resynthesis is performed on only the identified domain. Consequently, the remainder of the synthesized design is unaffected by the resynthesis process.

Only logical and buffer cells are considered for resynthesis. Non-logical cells are unchangeable, and therefore cannot be resynthesized. Thus, the process of the present invention to perform direct transformation of ECOs to the layout of the synthesized design can be used with any resynthesis system that makes logical and buffer local transformations. One example of such a resynthesis system is described in application Ser. No. 09/677,475 filed Oct. 2, 2000 by A. Zolotykh et al. for "Timing Driven Resynthesis" and assigned to the same assignee as the present invention.

The present invention provides a method of the direct transformation to transfer ECO changes to the synthesized design, without resynthesis of the portions of the source design that are not affected by the ECO. Thus, ECO changes are made to the synthesized design instead of the source design.

Figure 1:
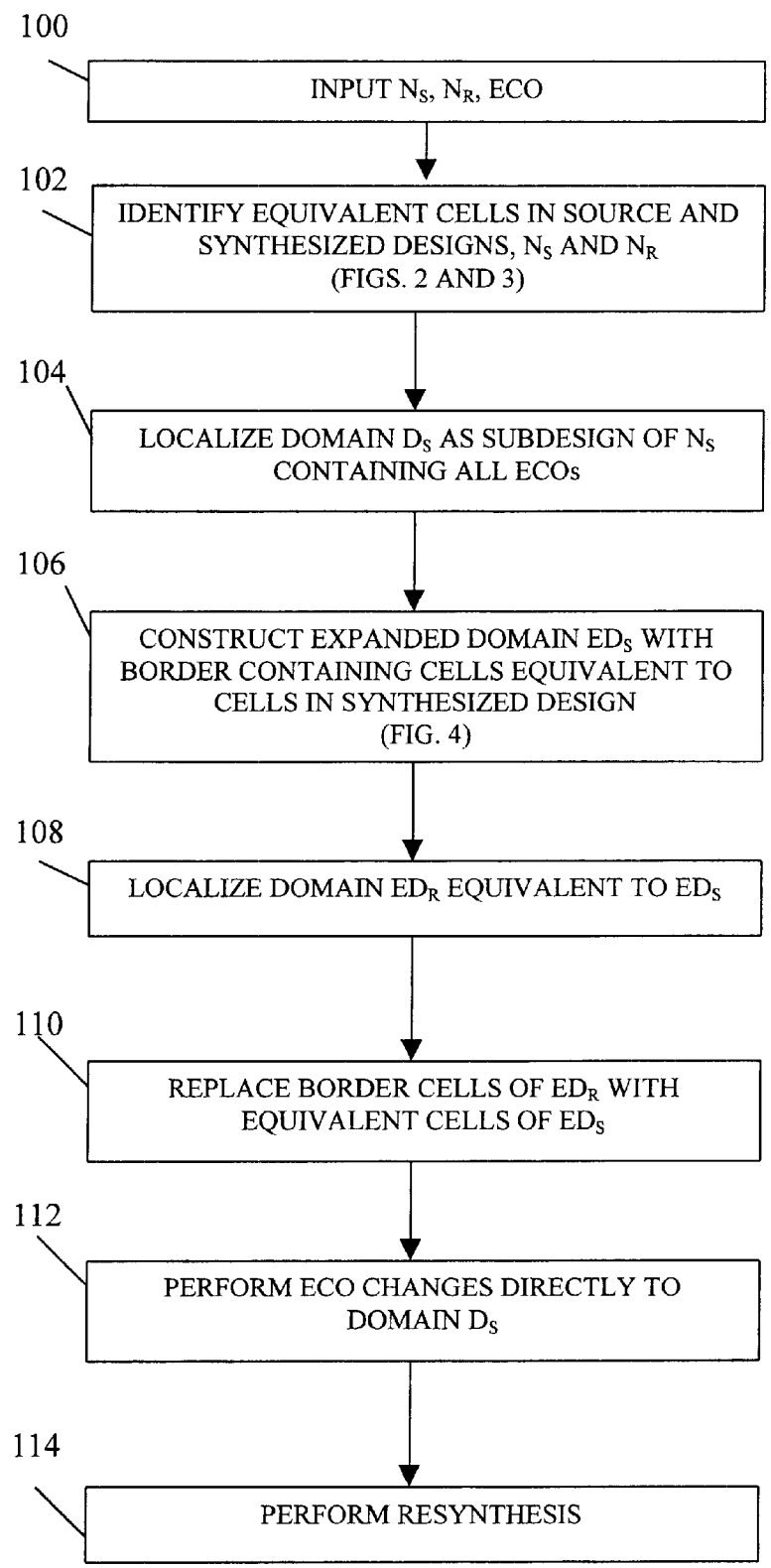
FIG. 1 is a flowchart of a process of executing engineering change orders on synthesized IC designs in accordance with a preferred embodiment of the present invention.

As shown in FIG. 1, the process of direct transformation of ECO changes to the design of an IC chip requires input at step 100 of two designs, the source design $N_S$ and the resynthesized (or synthesized) design $N_R$, as well as an ECO description that contains an engineering change order which should be applied to the source design.

Ordinarily design $N_R$ is a resynthesized design that has been optimized for path delays, cell area, etc. Alternatively, design $N_R$ is a design that has not been optimized by resynthesis, in which case optimization is performed during an optional resynthesis process of the present invention.

At step 102, a search is conducted for the equivalent cells that appear in both of the source and synthesized (or resynthesized) designs $N_S$ and $N_R$. In preferred embodiments, described in association with FIGS. 2 and 3, step 102 is performed by assigning ECO flags to each element of the source design $N_S$, and resynthesizing the synthesized design to assign the flags to a resynthesized design and to assign ECO flags to new cells created during resynthesis. Hence, cells of the resynthesized design carry the same ECO flags as equivalent cells of the source design.

At step 104, a domain $D_S$ is localized as a subdesign of the source design $N_S$ that contains all of the ECO changes. Domain $D_S$ is constructed as the set of all cells and wires of the source design $N_S$ whose names are mentioned in the ECO description.

Figure 4:
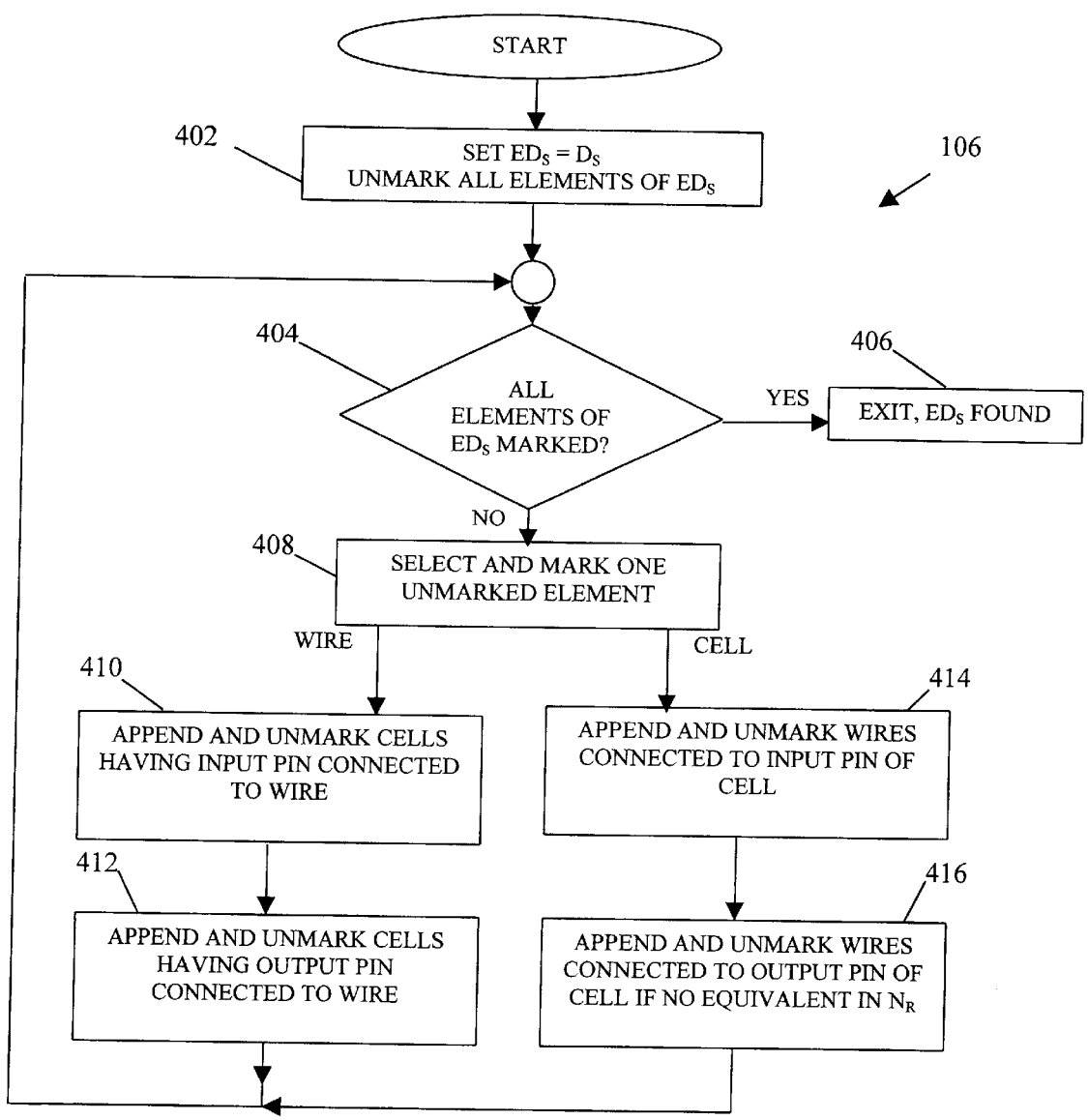
FIG. 4 is a flowchart of a subprocess of the process of FIG. 1 to define a domain containing cells in the synthesized design affected by the ECO.

At step 106, more fully described in association with FIG. 4, an expanded domain $ED_S$ is constructed containing the domain $D_S$ such that the border of $ED_S$ consists only of cells having equivalent cells in the resynthesized design.

At step 108, domain $ED_R$, which is equivalent to the expanded domain $ED_S$, is localized in the resynthesized design $N_R$. More particularly, all cells that are equivalent to border cells of the expanded domain $ED_S$ defined at step 106. These chosen cells form the border of the sought-for domain $ED_R$.

At this point, expanded domain $ED_S$ is equivalent to domain $ED_R$. Consequently, at step 110, the cells of the border domain $ED_R$ are replaced with equivalent cells of the border of the expanded domain $ED_S$ in the resynthesized design $N_R$. Consequently, domain $D_S$ is part of the design to be resynthesized, with all ECO changes situated inside the domain. Therefore, at step 112, the ECO changes are directly made to the domain $D_S$.

At step 114, resynthesis is performed on the substituted domain ($ED_S$) of the resynthesized design. This will require only a small amount of time because all of the local changes are inside of the domain $ED_R$ made in the resynthesized design. The result is a resynthesized design, in the form of a gate-level netlist, that includes the design changes directed by the ECO.

At step 102, cells of the design source $N_S$ are compared to cells of the synthesized design $N_R$ to identify equivalent cells. Only local logical and buffer cells of the source design can be transformed. Non-logical cells of the source design can be resized, but not transformed. Therefore the non-logical cells are not changeable in the synthesized design. Each non-logical cell of the source design has an equivalent cell of the synthesized design. The design source $N_S$ in RTL code has logical parts $LOG_S$, and the resynthesized (or synthesized) design $N_R$, or netlist, has logical parts $LOG_R$. The logical parts $LOG_S$ and $LOG_R$ are subdesigns of the $N_S$ and $N_R$ designs consisting of only logical cells. Because both designs $N_S$ and $N_R$ are equivalent, both have the same sets of non-logical cells, and the obtained logical parts $LOG_S$ and $LOG_R$ are also equivalent. The input pins of logical parts $LOG_S$ and $LOG_R$ are the same as the output pins of the non-logical cells.

Since the logical cell inputs can only have a value of 0 or 1, the inputs of the logical parts can be treated as Boolean variables. The logical parts $LOG_S$ and $LOG_R$ have equal sets of Boolean variables, denoted by $x_1, X_2, \ldots, X_m$. A Boolean function exists at each output pin of each logical cell of both the $N_S$ and $N_R$ designs, depending on the Boolean variables $X_1, X_2, \ldots, X_m$. This function describes how the value of the given output pin (0 or 1) depends on the values of the Boolean variables.

If $Cell_S$ and $Cell_R$ are logical cells of the source $N_S$ and synthesized $N_R$ designs, respectively, cells $Cell_S$ and $Cell_R$ are equivalent if and only if they have the same number of output pins and the Boolean functions related to their output pins are the same.

There are several techniques to detect equivalent logical cells in two equivalent designs. One method is based on a comparison or verification of cell function of cells in the two designs. While this technique is most powerful, it is also most time consuming. Another technique is based on a comparison of cell names. In most design formats, cell libraries are arranged by class, with names assigned to each cell based on a library protocol. An example of a resynthesis process employing the same cell names is described in the aforementioned Zolotykh et al. application. Using the resynthesis process described in the Zolotykh et al. application, only equivalent cells of the $N_S$ and $N_R$ designs have the same name. Thus, comparison of cell names as a technique to find equivalent cells in two different designs can be easily implemented but does not allow detection of a great number of equivalent cells.

Figure 2:
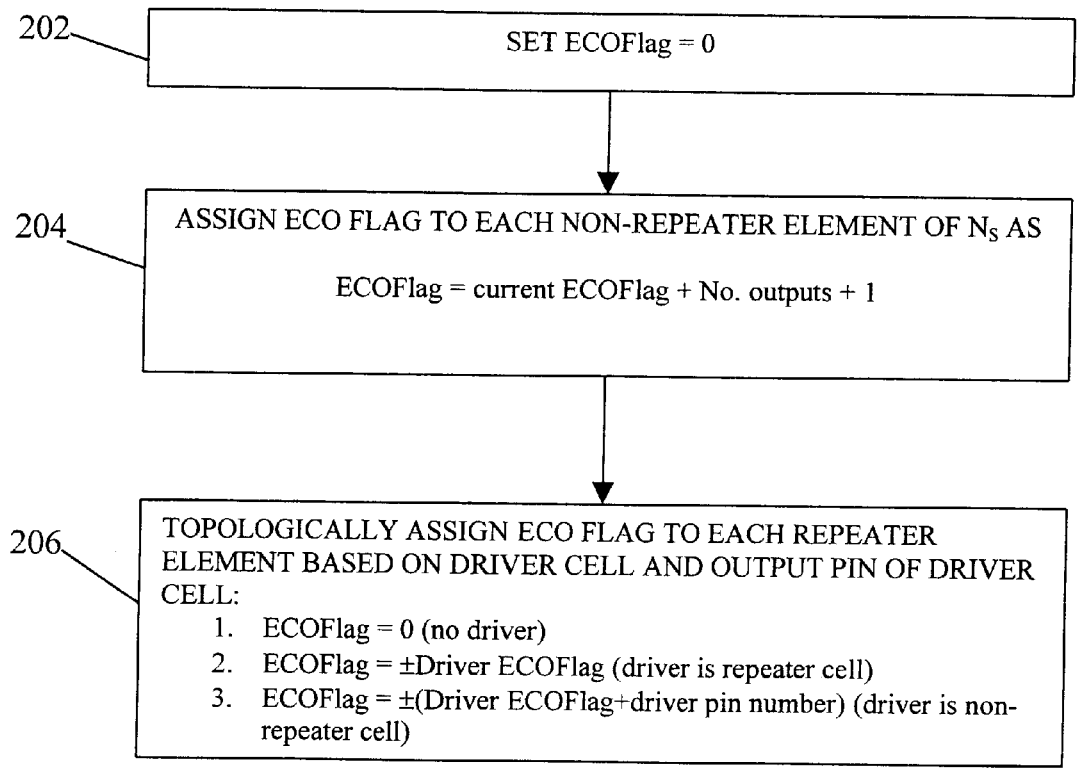
FIG. 2 is a flowchart of an optional subprocess for use in the process of FIG. 1 to identify equivalent cells in the source and synthesized designs.

Another technique to identify equivalent cells employs tags or ECO flags. The principle of this technique is to maintain information concerning equivalence of the cells during resynthesis. This is illustrated in FIG. 2, and is performed before resynthesis. At step 202, the initial ECO flag value is set to 1. At step 204, a unique integer ECO_flag is assigned to each non-repeater cell of the source design. A non-repeater cell is any cell other than a buffer or inverter, which are herein called repeater cells. More particularly, each non-repeater cell is assigned an ECO_flag value equal to the current ECO_flag value, plus the number of outputs of the non-repeater cell, plus 1:

ECO_flag=Current ECO_flag+no. cell outputs+1.

Thus if the current ECO_flag is 1 and the number of outputs of the current non-repeater cell is 5, the ECO_flag for the current non-repeater cell is 7.

After assigning ECO flags to each non-repeater cell, at step 206 ECO flags are assigned to all repeater cells depending on the ECO flags of their drivers. More particularly, each repeater cell is considered in topological order from the inputs of the logical part to the outputs. ECO_flag values are assigned based on the driver to the repeater cell and the output pin of the driver driving the repeater cell. Three conditions can exist:

1. If there is no driver for a repeater cell:
   ECO_flag=0.
2. If the driver cell is a repeater cell, the ECO flag for the repeater cell under consideration is set equal to that of the driver cell, except that the value of the flag is negative if the repeater cell under consideration is an inverter:
   ECO_flag=Driver ECO_flag
     (repeater is a buffer);
   ECO_flag=–Driver ECO_flag
     (repeater is an inverter).
3. If the driver cell is a non-repeater cell, the ECO flag for repeater cell under consideration is equal to that of the driver cell plus the number of the output pin to which the repeater cell is connected, except that the value of the flag is negative if the repeater cell under consideration is an inverter:
   ECO_flag=Driver ECO_flag+output number
     (if repeater is a buffer),
   ECO_flag=–(Driver ECO_flag+output number)
     (if repeater is an inverter).

A program code to accomplish assignment of flags to elements is as follows:

current_ECO_flag:=1
for each non-repeater cell
    non-repeater's ECO flag:=current_ECO_flag
    current_ECO_flag:=current_ECO_flag+number_of_cell_outputs+1
    for each repeater cell considered in the topological order (from the inputs of the logical part to the outputs)
        driver_cell:=driver of the repeater if (driver_cell is missing)
            repeater's ECO_flag:=0
        else if (driver_cell is a repeater cell)
            if (repeater is a buffer)
                repeater's ECO_flag:=ECO_flag of driver_cell
            else
                repeater's ECO_flag:=–ECO_flag of driver_cell
        else
            output:=number of the output pin of driver_cell connected to the repeater
            if (repeater is a buffer)
                repeater's ECO_flag:=ECO_flag of driver_cell+output
            else
                repeater's ECO_flag:=–(ECO_flag of driver_cell+output)

The above procedure first assigns a unique ECO flag to each non-repeater cell, and then assigns an ECO flag to each buffer and inverter depending on the type of driver cell and which output pin of the driver cell is connected to the input pin of the considered repeater.

Figure 3:
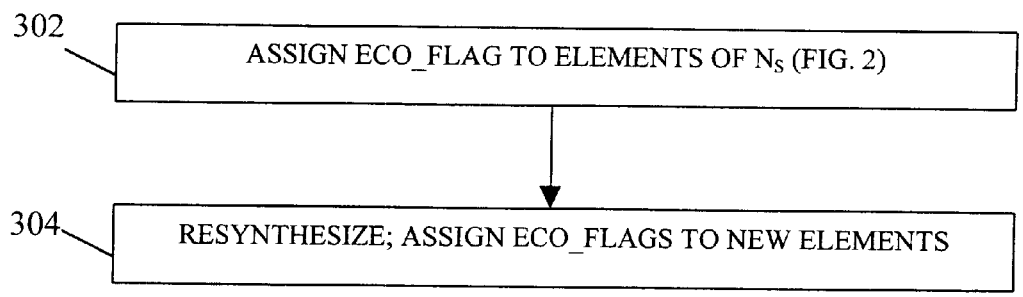
FIG. 3 is a flowchart of a subprocess of the process of FIG. 1 to assign flags to IC elements created during resynthesis.

As shown in FIG. 3, after creating ECO flags of the cells of the source design at step 302, a resynthesis procedure is performed at step 304 to apply the ECO flags to the synthesized design $N_R$. The ECO flags are applied to the synthesized design during or after optimization of path delays, cell area, gate sizes and other features, such as performed by a resynthesis process as described in the aforementioned Zolotykh et al. application. During this resynthesis process, the ECO flags of unchanged cells are not changed. Suitable ECO flags are calculated, as described in connection with FIG. 2, for new cells inserted during this resynthesis process. Two important conditions are valid during execution of the resynthesis is executed:

1) If a cell of the resynthesized design has the same ECO flag as some cell of the source design, then these two cells are equivalent;
2) If the ECO flag of a cell of the resynthesized design is opposite to the ECO flag of some cell of the source design, then one of these cells should be equivalent to the inversion of the other one.

Initially (when the two designs $N_S$ and $N_R$ are identical) these two conditions are valid. These conditions remain valid during resynthesis due to the resynthesis technique.

For example, consider the following transformation during the resynthesis:

$$X=OR3(A,B,C) \rightarrow Z=OR2(Y,C) Y=OR2(A,B)$$

This statement describes a resynthesis that one cell X, of the type OR3, is replaced by two cells Y and Z, each of the type OR2. There is no equivalent cell in the synthesized design that is equivalent to cell Y. Consequently, set ECO_flag of cell Y:=0. On the other hand, cell Z is equivalent to the cell X, so ECO_flag of cell Z:=ECO_flag of cell X.

Usually the resynthesis process can be considered as a set of consequent local transformations. Each transformation has one of the several fixed types applied by the resynthesis system, such as the above example. Consequently, each transformation type may be associated with a rule that defines ECO flags for all new cells created by local transformations. Because any resynthesis system has a finite number of transformation types and all these types are known, it becomes quite simple to devise rules for the definition of ECO flags for all new cells created during resynthesis.

One advantage of the technique herein described is that ECO flag definition requires a small amount of resources. One integer ECO flag is required to be store for each cell, and ECO flags may be changed while making transformations. On the other hand, the ECO flags permit quick location of equivalent cells, and are carried forward during the resynthesis process (step 114 in FIG. 1) for use in future design changes.

FIG. 4 illustrates the process of step 106 (FIG. 1) of constructing an expanded domain $ED_S$ containing the domain $D_S$, such that its border consists only of the cells having equivalent cells in the resynthesized design. At step 402, $ED_S$ is initialized as $ED_S = D_S$, and all elements of domain $ED_S$ (i.e. the cells and wires of the domain) are unmarked. At step 404, if all elements of the domain $ED_S$ are marked, the process exits at step 406 as domain $ED_S$ is found.

At step 408, any unmarked element of domain $ED_S$ is selected and marked. As will be explained, marked and unmarked cells will define the boundary of domain $ED_S$. If the chosen element is a wire, the process continues to step 410 where all cells having an input pin connected to the chosen wire are appended to the domain $ED_S$, and unmarked. At this point, if a cell has already been appended to domain $ED_S$, it is not appended again.

At step 412, cells having an output pin connected to the chosen wire are appended to domain $ED_S$ and unmarked these cells. Only those cells that have no equivalent cells in the resynthesized design and that have not appended to domain $ED_S$ are appended.

The process then loops back to step 404 to determine if all of the cells of $ED_S$ are marked. If not, another element is selected and marked and if the element is a wire, the process of steps 410 and 412 is repeated. If the element is a cell, all wires connected to the input pins of the chosen cell are appended to the domain $ED_S$ at step 414, and the wires are unmarked. Only those wires that have not appended to the domain $ED_S$ are appended.

If the cell chosen at step 408 has no equivalent cell in the resynthesized design then all wires connected to the output pins of the chosen cell are appended to domain $ED_S$ and unmarked at step 416. Again, only wires that have not appended to the domain $ED_S$ are appended.

The process loops back to step 404 and continues to loop through steps 408–416 until all of the elements of domain $ED_S$ have been marked. The expanded domain $ED_S$ is now found, with unmarked elements (wires and cells) forming the border of the domain. Thus, at step 108 (FIG. 1), localizing the domain $ED_R$ of the resynthesized design $N_R$ equivalent to the expanded domain $ED_S$ requires selection of all cells equivalent to the border cells of the expanded domain $ED_S$, which are the unmarked cells that form the border of the sought domain $ED_R$.

The present invention thus provides a process of executing at least one change to a gate-level netlist. The change is incorporating in cells of a synthesizable source design. At least one domain is defined in the netlist such that the domain contains cells that are equivalent to the cells of the source design that incorporate the change. The cells of the synthesizable source design that incorporate the change are substituted for the domain in the netlist. The substituted synthesizable source design domain is resynthesized into the gate-level netlist.

In one form, the invention is carried out though use of a computer programmed to carry out the process. A computer readable program code is embedded in a computer readable storage medium, such as a disk drive, and contains instructions that cause the computer to carry out the steps of the process of altering a synthesized integrated circuit design by at least one change. More particularly, the computer readable code causes the computer to identify a domain containing at least one change to the IC design within the source design of the integrated circuit. The code further causes the computer to identify a domain within the synthesized design containing synthesized design cells that are equivalent to the source design cells in the first domain. The code further causes the computer to perform the changes on the synthesized design cells in the domain containing synthesized design cells.

Although the present invention has been described with reference to preferred embodiments, workers skilled in the art will recognize that changes may be made in form and detail without departing from the spirit and scope of the invention.

What is claimed is:

1. A process of executing at least one change to a gate-level netlist comprising steps of:
   a) incorporating the at least one change to cells of a synthesizable source design;
   b) using logic cells incorporating the change to the synthesizable source design to define at least one domain of the netlist containing cells that are equivalent to the cells of the source design that incorporate the at least one change;
   c) substituting the cells of the source design that incorporate the at least one change for the domain; and
   d) resynthesizing the substituted cells into the gate-level netlist.

2. A process of altering a gate-level netlist with at least one change, wherein the netlist includes cells defining the circuit and wherein the at least one change is incorporated in a source design, the process comprising steps of:
   a) identifying all source design cells within the source affected by the at least one change;
   b) defining a first domain based on identified logic cells within the source design;
   c) identifying a second domain within the netlist containing synthesized design cells that are equivalent to the source design cells in the first domain;
   d) substituting the first domain for the second domain; and
   e) performing the changes on the substituted first domain.

3. The process of claim 2, wherein step (c) comprises steps of:
   c1) identifying synthesized design cells in the netlist that are equivalent to source design cells in the source design,
   c2) identifying a border of the first domain comprising all source design cells and wires that are outside of the first domain and are coupled to a source design cell in the first domain, and
   c3) selecting synthesized design cells that are equivalent to source design cells in at least the border.

4. The process of claim 3, wherein step (c1) comprises steps of:
   c1a) append and tag cells outside of the first domain having input or output pins connected to each wire in the first domain, and
   c1b) append and tag wires outside of the first domain connected to input or output pins of each cell in the first domain.

5. The process of claim 4, wherein step (c3) comprises steps of:
   c3a) selecting synthesized design cells that are equivalent to source design cells in the first domain, and
   c3b) selecting synthesized design cells that are equivalent to tagged source design cells.

6. The process of claim 3, wherein step (d) comprises steps of:
   d1) replacing the synthesized design cells that are equivalent to source design cells within the border with source design cells, and
   d2) performing the at least one change on the substituted source design cells.

7. The process of claim 6, further including a step of:
   e) after step (ed), resynthesizing the substituted domain.

8. The process of claim 2, further including a step of:
   e) after step (de), resynthesizing the substituted domain.

9. The process of claim 2, wherein each cell of the source design and netlist includes a flag, the flags of synthesized design cells that are equivalent to source design cells being based on the flag of the respective equivalent source design cell.

10. The process of claim 9, wherein flags are assigned to the cells of the source design and netlist by performing steps of:
    assigning a flag to each non-repeater source design cell of the source design based on first criteria,
    topologically assigning a flag to each repeater source design cell of the source design based on second criteria,
    synthesizing the source design to derive synthesized design cells,
    assigning a flag to each synthesized design cell that is equivalent to a source design cell, the flag assigned to each equivalent synthesized design cell being based on the flag of the equivalent source design cell, and assigning a flag to each synthesized design cell that is not equivalent to a design source cell, the flag assigned to each non-equivalent synthesized design cell being based on one of the first and second criteria.

11. The process of claim 10, wherein the first criteria assigns a flag having a value based on the a current flag value and the number of outputs of non-repeater cell, and the second criteria assigns a flag having a value based on a flag of a driver cell or a flag of a driver and a driver pin number.

12. The process of claim 10, wherein step (a) comprises comparing the flags of the source design and netlist cells to identify equivalent cells.

13. A storage medium having stored therein processor executable instructions that enable a processor to apply at least one change to a gate-level netlist incorporated in cells of a synthesizable source design, the processor executable instructions including:

first identifying instructions that enable the processor to identify all source design cells affected by the at least one change;

domain defining instructions that enable the processor to define a first domain based on identified logic cells of the source design;

second identifying instructions that enable the processor to identify a second domain within the netlist containing synthesized design cells that are equivalent to the source design cells in the first domain;

substitution instructions that enable the processor to substitute the first domain for the second domain; and changing instructions that enable the processor to perform the changes on the substituted first domain.

14. The storage medium of claim 13, wherein the processor executable instructions further include:

third identifying instructions that enable the processor to identify synthesized design cells in the netlist that are equivalent to source design cells in the source design, fifth identifying instructions that enable the processor to identify a border of the first domain comprising all source design cells and wires that are outside of the first domain and are coupled to a source design cell in the first domain, and selecting instructions that enable the processor to select synthesized design cells that are equivalent to source design cells in at least the border.

15. The storage medium of claim 14, wherein the processor executable instructions further include:

instructions that enable the processor to append and tag cells outside of the first domain having input or output pins connected to each wire in the first domain, and instructions that enable the processor to append and tag wires outside of the first domain connected to input or output pins of each cell in the first domain.

16. The storage medium of claim 15, wherein the processor executable instructions further include:

instructions that enable the processor to select synthesized design cells that are equivalent to source design cells in the first domain, and instructions that enable the processor to select synthesized design cells that are equivalent to tagged source design cells.

17. The storage medium of claim 13, wherein each cell of the source design and netlist includes a flag, the flags of synthesized design cells that are equivalent to source design cells being based on the flag of the respective equivalent source design cell.

18. The storage medium of claim 17, wherein the instructions for assigning flags to the cells of the source design and netlist include:

instructions that enable the processor to assign a flag to each non-repeater source design cell of the source design based on first criteria, instructions that enable the processor to topologically assign a flag to each repeater source design cell of the source design based on second criteria, instructions that enable the processor to synthesize the source design to derive synthesized design cells, instructions that enable the processor to assign a flag to each synthesized design cell that is equivalent to a source design cell, the flag assigned to each equivalent synthesized design cell being based on the flag of the equivalent source design cell, and instructions that enable the processor to assign a flag to each synthesized design cell that is not equivalent to a design source cell, the flag assigned to each non-equivalent synthesized design cell being based on one of the first and second criteria.

19. A process of identifying a domain within a netlist containing synthesized design cells that are equivalent to cells in a domain of a source design comprising steps of:

identifying synthesized design cells in the netlist that are equivalent to source design cells in the source design, identifying a border of the domain of the source design that comprises all source design cells and wires that are outside of the domain of the source design and are coupled to a logic cell in the domain of the source design, and selecting synthesized design cells that are equivalent to cells in at least the border.

20. The process of claim 19, including steps of:

appending and tagging cells outside of the domain of the source design having input or output pins connected to each wire in the domain of the source design, and appending and tagging wires outside of the domain of the source design connected to input or output pins of each cell in the domain of the source design.

21. The process of claim 20, including steps of:

selecting synthesized design cells that are equivalent to source design cells in the domain of the source design, and selecting synthesized design cells that are equivalent to tagged source design cells.

* * * * *